(12) United States Patent
Wang et al.

(10) Patent No.: US 7,662,661 B2
(45) Date of Patent: Feb. 16, 2010

(54) METHOD OF MANUFACTURING A SUBSTRATE STRUCTURE FOR INCREASING CUTTING PRECISION AND STRENGTH THEREOF

(75) Inventors: Bily Wang, Hsin Chu (TW); Jonnie Chuang, Pan Chiao (TW); Hui-Yen Huang, Hsin Chu (TW)

(73) Assignee: Harvatek Corporation, Hsin Chu (TW)

( * ) Notice: Subject to any disclaimer, the term of this patent is extended or adjusted under 35 U.S.C. 154(b) by 511 days.

(21) Appl. No.: 11/304,558

(22) Filed: Dec. 16, 2005

(65) Prior Publication Data

US 2006/0099728 A1    May 11, 2006

Related U.S. Application Data

(63) Continuation-in-part of application No. 10/918,371, filed on Aug. 16, 2004, now abandoned.

(51) Int. Cl.
*H01L 21/66* (2006.01)
*G01R 31/26* (2006.01)
*H01L 21/00* (2006.01)
*H01L 21/50* (2006.01)
*H01L 21/48* (2006.01)
*H01L 21/44* (2006.01)

(52) U.S. Cl. .................... 438/106; 438/14; 438/15; 438/25; 438/26; 438/48; 438/51; 438/55; 438/64; 438/68; 438/113; 257/E21.237; 257/E21.238; 257/E21.513

(58) Field of Classification Search .................. 257/E21.237–E21.238, E21.513
See application file for complete search history.

(56) References Cited

U.S. PATENT DOCUMENTS

| | | | | |
|---|---|---|---|---|
| 5,422,150 A * | 6/1995 | Scoular et al. | ............ | 428/33 |
| 5,473,120 A * | 12/1995 | Ito et al. | ............ | 174/264 |
| 6,286,207 B1 * | 9/2001 | Oura et al. | ............ | 29/846 |
| 6,555,762 B2 * | 4/2003 | Appelt et al. | ............ | 174/264 |
| 6,599,768 B1 * | 7/2003 | Chen | ............ | 438/22 |
| 6,885,037 B1 * | 4/2005 | Wang et al. | ............ | 257/99 |
| 2003/0045031 A1 * | 3/2003 | Kobayashi | ............ | 438/113 |
| 2004/0121563 A1 * | 6/2004 | Farnworth et al. | ............ | 438/465 |

* cited by examiner

*Primary Examiner*—Charles D Garber
*Assistant Examiner*—Mohsen Ahmadi
(74) *Attorney, Agent, or Firm*—Rosenberg, Klein & Lee

(57) ABSTRACT

A method of manufacturing a substrate structure includes the steps of: (1) providing a metal substrate having a metal portion; (2) chemically etching a plurality of trenches in the metal substrate; (3) applying a polymer composite material into the trenches to form a substrate having a polymer composite portion abutted to the metal portion; (4) polishing a surface of the substrate to make a height of the polymer composite portion equal to that of the metal portion; (5) forming a covering material on the surface of the substrate; and (6) cutting the substrate via the polymer composite portion for decreasing cutting bur produced on the metal portion. Furthermore, the method is provided for combining the metal substrate and the polymer composite material, thereby to increase cutting precision and strength of the substrate structure.

5 Claims, 7 Drawing Sheets

METHOD OF MANUFACTURING A SUBSTRATE STRUCTURE FOR INCREASING CUTTING PRECISION AND STRENGTH THEREOF

CROSS-REFERENCE TO RELATED APPLICATIONS

This Application is a Continuation-in-Part of application Ser. No. 10/918,371, filed on 16 Aug. 2004 now abandoned, and entitled METHOD OF MANUFACTURING A SUBSTRATE STRUCTURE FOR INCREASING CUTTING PRECISION AND STRENGTH THEREOF.

BACKGROUND OF THE INVENTION

1. Field of the Invention

The present invention relates to a method of manufacturing a substrate structure provided for mounting a light emitting diode (LED) thereon, and more particularly, relates to a manufacturing method for increasing cutting precision and strength of the substrate structure.

2. Description of the Related Art

In the electronic industry, the electronic packaging industry will gradually get important due to electronic products which are required in light, thin, short, small and high function besides the semiconductor industry. The packaging technique in the electronic packaging industry will find new ways of doing things from old theories, such as a ball gate array package, a plastic pin-grid array package, TQFP, TSOP, etc.

In a conventional electronic packaging technique, a semiconductor integrated circuit is manufactured and then assembled with other electronic elements to become an electronic product for achieving a specific design function. The electronic packaging technique provides four main functions, which respectively are power distribution, signal distribution, heat dissipation, and protection and support, applying to IC chap packaging and LED packaging.

The electronic packaging technique can be divided into different levels, as follows. A first level packaging (or chip level packaging) is provided for combining the IC chip with the packaging structure to form an electronic module. In plastic dual-in-line package (PDIP), the first level packaging includes die attach, wire bond and encapsulation. A second level packaging is provided for assembling the electronic module on the circuit board to form a circuit card or a printed circuit board. In the second level packaging, it is noticed to manufacture of the circuit board and connection technique between the electronic elements and the circuit board, such as a pin through hole (PTH) and a surface mount technology (SMT). A third and fourth level packages are provided for combination of the circuit board and the circuit card to form sub-system and system.

Referring to FIG. 1, a conventional metal substrate 1a will be cut by a cutter 12a. When cutting, the conventional metal substrate 1a will have some cutting questions due to the structure strength and the cutting precision, thereby to easily produce cutting bur and structure deformation. Further, it will affect the cutting speed and precision, thereby to increase defective fraction of the packaging product.

The present invention has been conceived to solve the problem in the background art, and the object of the present invention is to provide a method for combining the substrate with the polymer composite material, thereby to raise cutting precision and strength of the semiconductor substrate structure.

SUMMARY OF THE INVENTION

It is therefore a principal object of the present invention to provide a semiconductor substrate structure, which can obtain better structure strength so as to easily be cut and keep better cutting precision.

Another object of the present invention is to provide a method of manufacturing a substrate structure provided for mounting a light emitting diode (LED) thereon, which can obtain lower cost and high quality of packaging processing.

To achieve the above object, one feature of the present invention is provided for a method of manufacturing a substrate structure
including: (1) providing a metal substrate having a metal portion; (2) chemically etching a plurality of trenches in the metal substrate; (3) applying a polymer composite material into the trenches to form a substrate having a polymer composite portion abutted to the metal portion; (4) polishing a surface of the substrate to make a height of the polymer composite portion equal to that of the metal portion; (5) forming a covering material on the surface of the substrate; and (6) cutting the substrate via the polymer composite portion for decreasing cutting bur produced on the metal portion.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
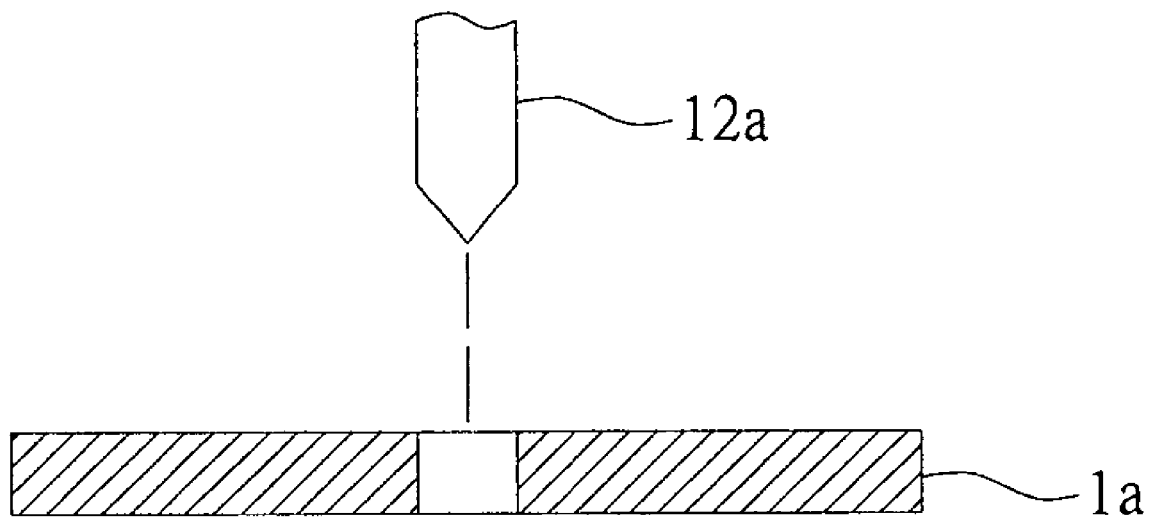
FIG. 1 is a schematic view of a conventional substrate structure in a cutting condition.
Figure 2A:
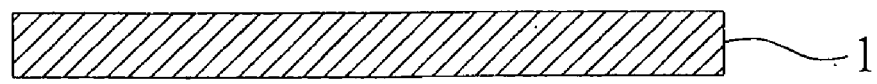
FIGS. 2A-2F are cross-sectional views illustrating a sequence of steps for a method of manufacturing a substrate structure in accordance with the present invention.
Figure 2B:
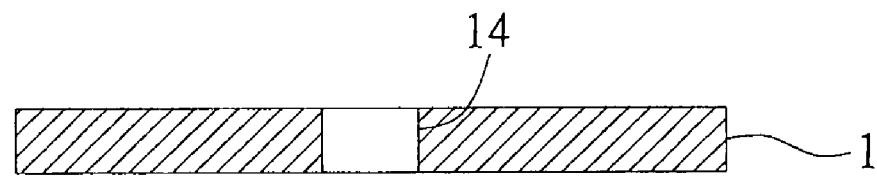
Figure 2C:
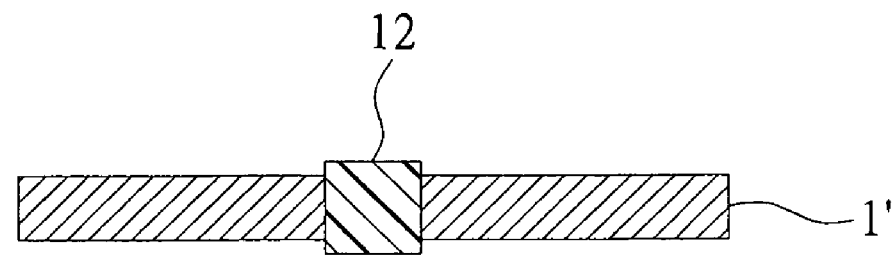
Figure 2D:
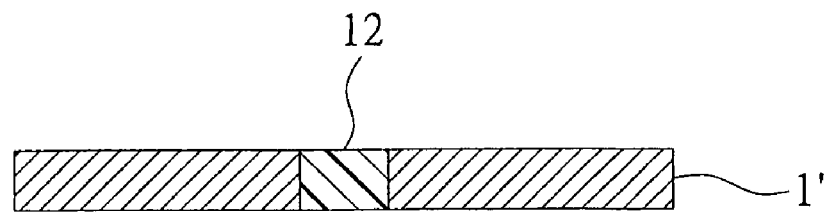
Figure 2E:
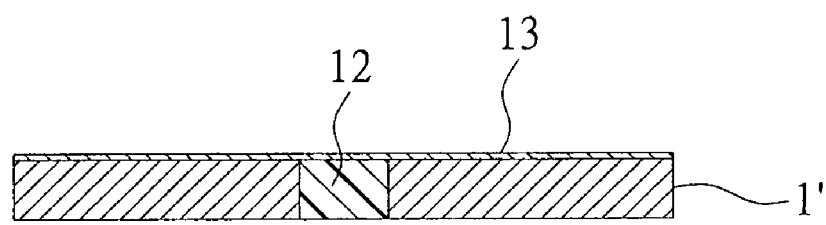
Figure 2F:
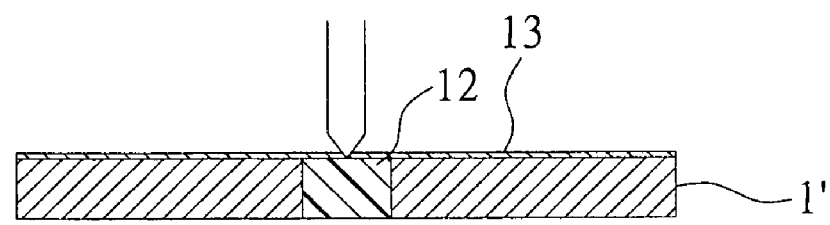

Referring now to the drawings wherein the showings are for purposes of illustrating preferred embodiments of the present invention only, and not for purposes of limiting the same, FIGS. 2A-2F are cross-sectional views illustrating a sequence of steps for a method of manufacturing a substrate structure in accordance with the present invention.

Please refer to FIGS. 2A-2F, a method of manufacturing a substrate structure provided for mounting a light emitting diode (LED) thereon includes the steps of: (1) providing a metal substrate 1 having a metal portion 10; (2) roughing a surface of the metal substrate by means of a chemical process or a sand-blasting process; (3) chemically etching a plurality of trenches 14 in the metal substrate 1; (4) applying a polymer composite material (such as a polyethylene material, PE) by means of a screen printing process or a steel plate printing process or an insert molding process into the trenches 14 to form a substrate 1' having a polymer composite portion 12 abutted to the metal portion 10; (5) polishing or sand-blasting a surface of the substrate 1' to make a height of the polymer composite portion 12 equal to that of the metal portion 10; (6) forming a covering material (such as a conductive layer 13) by means of an electroplating process on the surface of the substrate; and (7) cutting the substrate via the polymer composite portion 12 for decreasing cutting bur produced on the metal portion.

Figure 3:
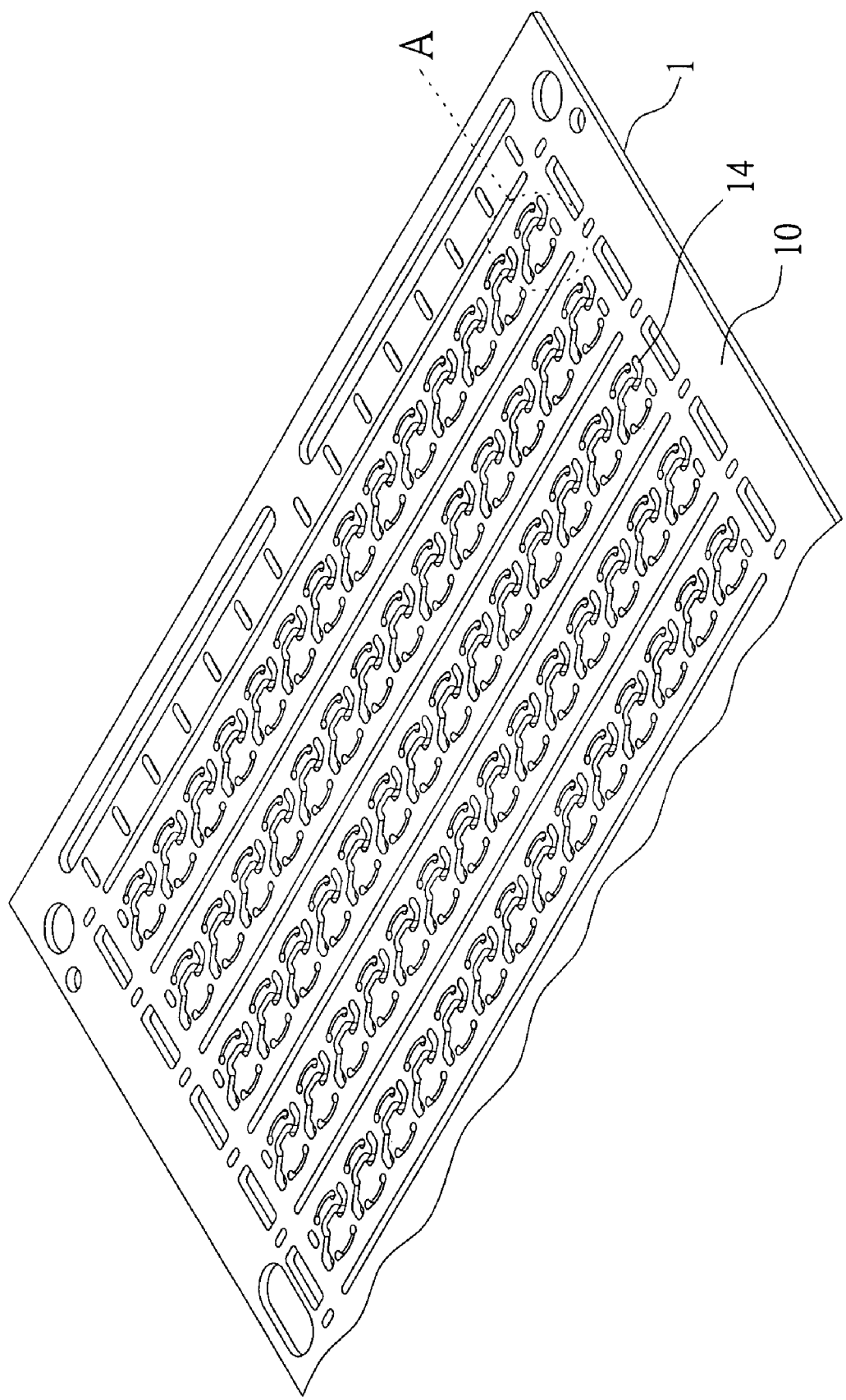
FIG. 3 is a perspective view of a metal substrate having a plurality of trenches after the step of chemically etching.
Figure 3A:
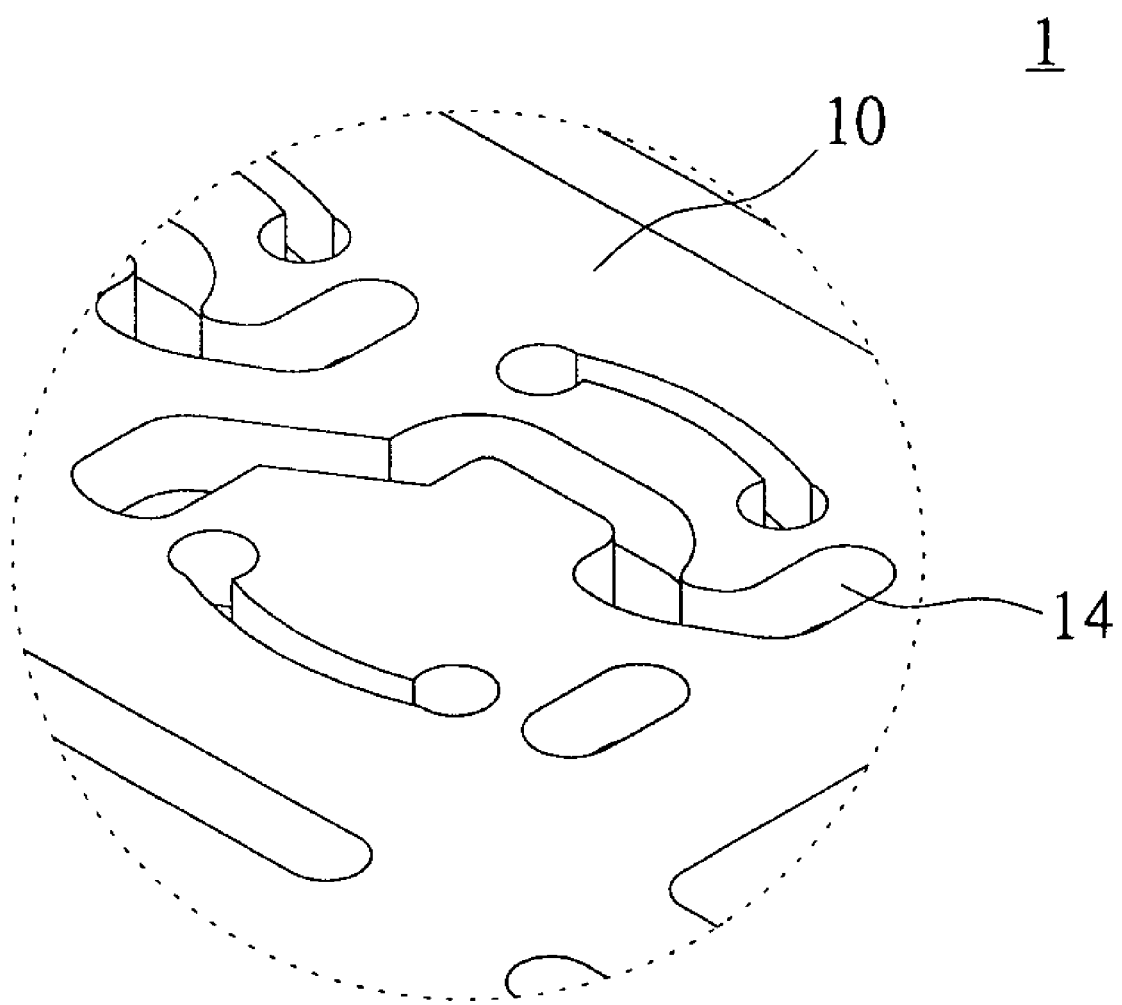
FIG. 3A is an enlarged view of "A" part of FIG. 3.
Figure 4:
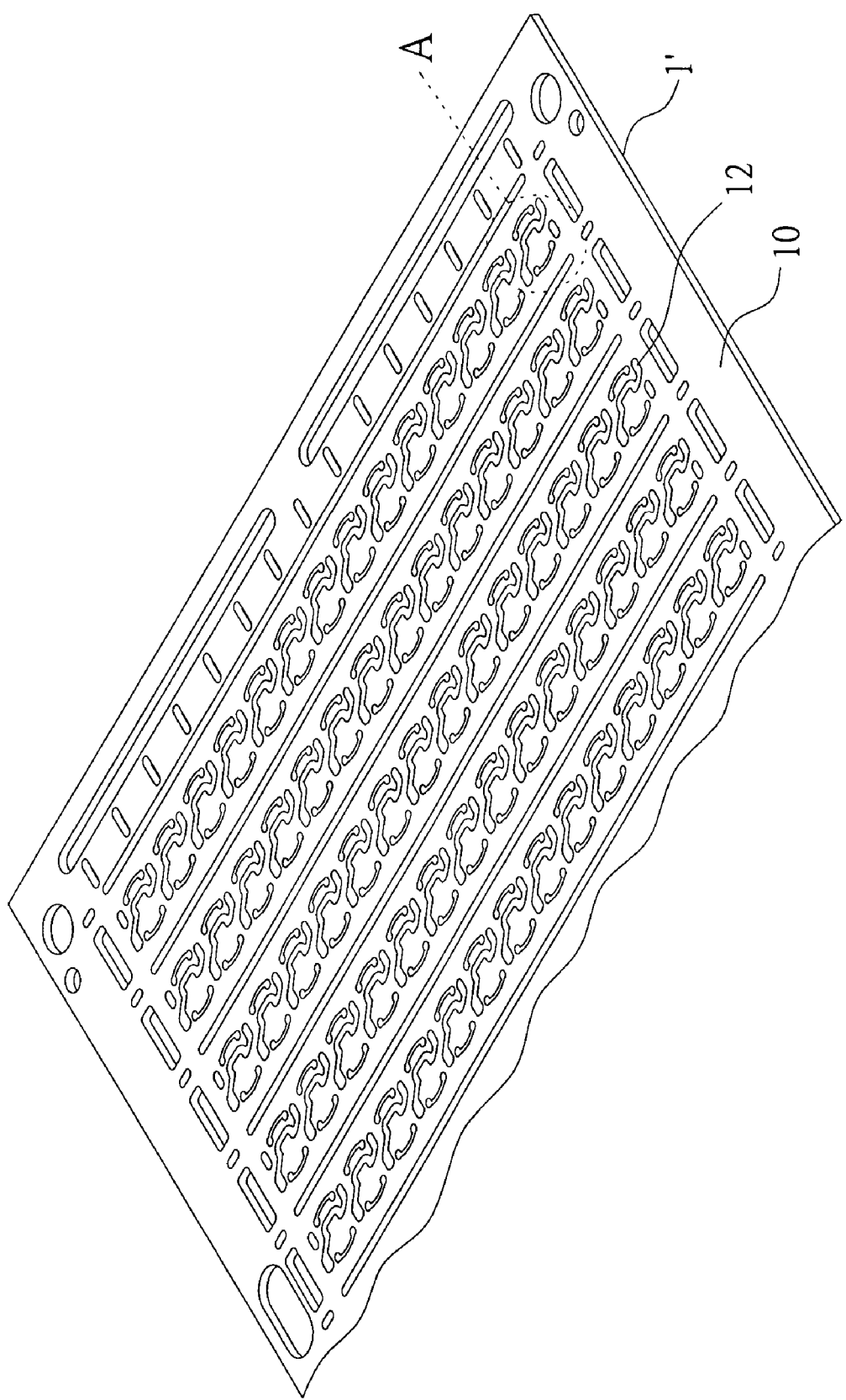
FIG. 4 is a perspective view of a substrate having a polymer composite portion after the step of filling a polymer composite material.
Figure 4A:
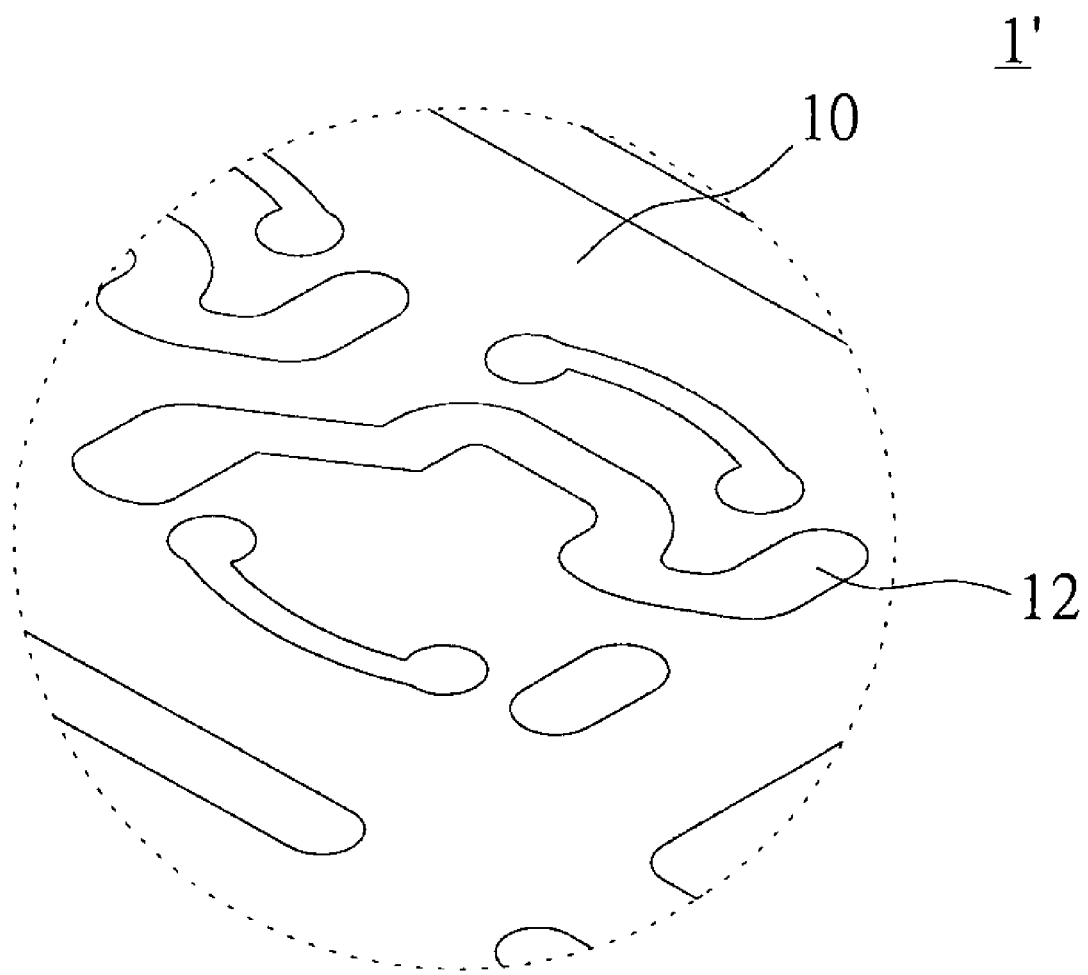
FIG. 4A is an enlarged view of "A" part of FIG. 5.

FIG. 3 or FIG. 3A shows a perspective view of the metal substrate 1 with the metal portion 10 and the trenches 14 after the step of chemically etching the trenches 14. FIG. 4 or FIG. 4A shows a perspective view of the substrate 1' with the metal portion 10 and the polymer composite portion 12 after the step of filling the polymer composite material.

The present invention has a main feature in that: the metal substrate and the polymer material are combined together, thereby to improve the material property of the substrate structure, to provide lower equipment cost and not affect chip packaging process.

The mechanical equipments for applying the polymer composite material supplied into the trench of the substrate or polishing the surface of the substrate will not need the high cost, thereby easy to obtain or install. The substrate structure of the present invention is a strong structure and to be cut easily. Further, the process method of the present invention will not affect the original packaging process, and it can be operated into the original packaging process due to the unchanged packaging machine to achieve the present requirement.

The present invention has following advantages: (1) the arrangement of new manufacturing process is easy, so that the requirement of price and technique of new equipment is not high; (2) the mechanical strength of the substrate structure is better; (3) the cutting of the substrate structure is easy; and (4) the original packaging machine still can be used in the original packaging process.

While the preferred embodiment in accordance with the present invention has been shown and described, and the alternative embodiment has been described, equivalent modifications and changes known to persons skilled in the art according to the spirit of the present invention are considered to be within the scope of the present invention as defined in the appended claims.

What is claimed is:

1. A method of manufacturing a substrate structure provided for mounting a light emitting diode (LED) thereon, comprising:
   providing a metal substrate having a metal portion;
   chemically etching a plurality of trenches in the metal substrate;
   applying a polymer composite material into the trenches to form a substrate having a polymer composite portion abutted to the metal portion;
   polishing a surface of the substrate to make a thickness of the polymer composite portion equal to that of the metal portion, wherein a height of a top and bottom surface of the polymer composite portion coincides with a top and bottom surface respectively, of the metal portion;
   forming a covering material over the entire surface of the substrate; and
   cutting through the polymer composite portion in at least one trench to cut the substrate for decreasing cutting bur produced on the top and bottom surface of the metal portion.

2. The method of claim 1, further comprising the step of roughing a surface of the metal substrate by means of chemical process or a sand-blasting process before the step of chemically etching.

3. The method of claim 1, wherein the step of applying includes the step of applying the polymer composite material using a screen printing process or a steel plate printing process.

4. The method of claim 1, wherein the step of applying includes the step of applying the polymer composite material using an insert molding process.

5. The method of claim 1, wherein the step of forming the covering material includes the step of electroplating a conductive layer onto the surface of the substrate.

* * * * *